(12) United States Patent
Kobayakawa

(10) Patent No.: US 6,794,736 B1
(45) Date of Patent: Sep. 21, 2004

(54) SEMICONDUCTOR DEVICE

(75) Inventor: Masahiko Kobayakawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/462,847

(22) Filed: Jun. 16, 2003

(30) Foreign Application Priority Data

Jun. 18, 2002 (JP) ........................................ 2002-176821

(51) Int. Cl.$^7$ ................................................ H01L 23/34
(52) U.S. Cl. ........................ 257/666; 257/678; 257/684; 257/687
(58) Field of Search ................................. 257/666, 684, 257/676, 675, 687

(56) References Cited

U.S. PATENT DOCUMENTS 6,198,171 B1   3/2001   Huang et al.
6,437,429 B1   8/2002   Su et al.
6,709,892 B2 *  3/2004   Kobayakawa et al. ...... 438/111

* cited by examiner

Primary Examiner—Roy Potter
(74) Attorney, Agent, or Firm—Merchant & Gould P.C.

(57) ABSTRACT

A semiconductor device includes a semiconductor chip, a plurality of conductors electrically connected to the semiconductor chip, and a resin package for sealing the semiconductor chip and the conductors. Each of the conductors has a thicker portion and a thinner portion. The thicker portion includes a lower surface exposed at a bottom surface of the resin package as a terminal for surface-mounting. The thicker portion of at least one of the conductors is non-rectangular with partially or entirely uneven width.

7 Claims, 6 Drawing Sheets

SEMICONDUCTOR DEVICE

BACKGROUND OF THE INVENTION

1. Field of the Invention

The present invention relates to a resin-packaged semiconductor device.

2. Description of the Related Art

An example of prior art semiconductor device is shown in FIGS. 9A and 9B. The illustrated semiconductor device includes a semiconductor chip 9, a pair of conductors 8A, 8B made of a metal plate, and a resin package 7 for sealing them. The semiconductor chip 9 is mounted on the conductor 8A, and the conductor 8A is electrically connected to a lower electrode (not shown) of the semiconductor device 9. The semiconductor chip 9 includes an upper electrode 90 electrically connected to the conductor 8B via a wire W. The paired conductors 8A, 8B respectively include a thicker portion 81a, 81b and a thinner portion 82a, 82b. The thicker portion 81a, 81b has a lower surface exposed at the bottom surface of the resin package 7 as a terminal 83a, 83b for surface-mounting. As shown in FIG. 9B, the terminal 83a, 83b is rectangular.

With this structure, the semiconductor device can be surface-mounted on a desired portion by utilizing the terminals 83a, 83b. Since each of the conductors 8A, 8B includes an upper surface having a larger area than that of the terminal 83a, 83b, the semiconductor chip 9 and the wire W can be appropriately bonded to these portions. The thinner portions 82a, 82b of the conductors 8A, 8B are sealed in the resin package 7. Consequently, part of the resin content of the resin package 7 exists under the thinner portion 82a, 82b for fixing and supporting the conductors 8A, 8B.

However, the above-described prior art semiconductor device has the following disadvantages.

Due to a strong demand for an overall size reduction in the field of semiconductor devices, the semiconductor device needs to be reduced with respect to its length, width, and/or height. In realizing such a size reduction of the semiconductor device, it may be difficult for the conductor 8B to have an enough size as a whole because the conductor 8A must have a sufficient size for mounting the semiconductor chip. Even under such a situation, the terminal 83b must have a reasonable size for appropriate surface-mounting.

To increase the terminal 83b in size, the thicker portion 81b may have an increased dimension b, as shown in FIG. 9A. However, the dimension a of the thinner portion 82b reduces due to this structure, resulting in a reduction of the resin content of the resin package 7 existing directly under the thinner portion 82b. As a result, the resin package 7 may not provide sufficient support for the conductor 8B, which may easily cause crack formation at the corners of the resin package 7.

Further, if the width c of the thicker portion 81b is increased to increase the area of the terminal 83b, the resin package 7 will have a correspondingly reduced width d on both sides of the thicker portion 81b. Consequently, crack formation may easily occur in these areas. Particularly, in molding the resin package 7, the corners of the resin package 7 may be insufficiently filled with resin because of the reduced width d, which may easily leads to crack formation.

Thus, an attempt to reduce the overall size of the conventional semiconductor device will lead to higher likelihood of crack formation with respect to the resin package 7, consequently posing a hinderance to a size reduction of the semiconductor device. While the above description is given only with respect to easier crack formation near the conductor 8B which is reduced in size, the same problem may also apply to the relationship between the conductor 8A and the resin package 7.

SUMMARY OF THE INVENTION

It is an object of the present invention to provide a semiconductor device which, even if reduced in overall size, is unlikely to suffer crack formation with respect to a resin package, and which can be appropriately surface-mounted on a desired portion.

According to the present invention, a semiconductor device is provided which comprises a semiconductor chip, a plurality of conductors electrically connected to an electrode of the semiconductor chip, and a resin package for sealing the semiconductor chip and the conductors. Each of the conductors has a thicker portion and a thinner portion. The thicker portion includes a lower surface exposed at a bottom surface of the resin package as a terminal for surface-mounting. The thicker portion of at least one of the conductors is non-rectangular with partially or entirely uneven width.

According to the present invention, the non-rectangular thicker portion includes a relatively wide portion and a relatively narrow portion due to its partially or entirely uneven width. Due to the provision of the thicker portion and the thinner portion for the conductor, a width decrease of the thicker portion results in a corresponding size increase of the thinner portion. According to the present invention, therefore, even where the conductor cannot be made to have a sufficient overall size, the thicker portion and the terminal provided by the thicker portion for surface-mounting can retain a reasonable size for surface-mounting without unduly reducing the area of the thinner portion, as opposed to the prior art semiconductor. As a result, according to the present invention, the semiconductor device is unlikely to suffer crack formation with respect to the resin package while being capable of being appropriately surface-mounted on a desired portion, thereby contributing to an overall size reduction.

According to a preferable embodiment of the present invention, the resin package includes a pair of first side surfaces spaced in a direction x, and a pair of second side surfaces spaced in a direction y perpendicular to the direction x. The terminals of the conductors are paired with and spaced from each other in the direction x. The non-rectangular thicker portion includes a tapered portion having width increasing in the direction y toward a center of the resin package. The tapered portion may be generally trapezoidal, triangular, or semicircular.

With this structure, when the resin package is formed by utilizing a mold, the tapered portion functions as a guide for molding resin to smoothly flow into the corners of the resin package (where the first and the second side meet). Consequently, the corners of the resin package are prevented from remaining incompletely filled with resin, thereby reducing the possibility of crack formation.

Preferably, the conductor has an outer end projecting from a respective first side surface and formed with a recess. With this structure, solder flows into the recess to increase the bonding area of the solder relative to the conductor in surface-mounting the semiconductor device, which improves the mounting strength of the semiconductor device.

Preferably, the recess extends over an entire thickness of the thicker portion. This helps the solder smoothly flow into the recess.

Other features and advantages of the present invention will become clearer from the detailed description of the preferred embodiments given.

DETAILED DESCRIPTION OF THE PREFERRED EMBODIMENTS

Preferred embodiments of the present invention will be described below in detail with reference to the accompanying drawings.

Figure 1A:
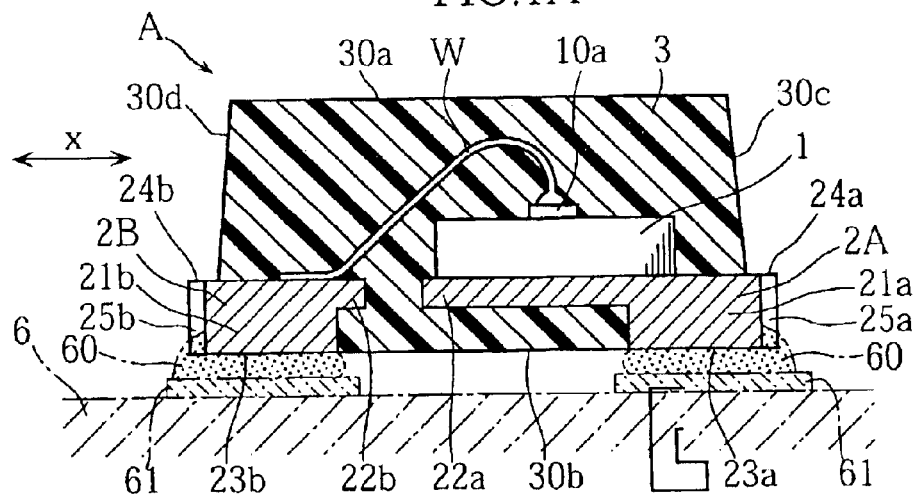
FIG. 1A is a sectional view showing a semiconductor device according to a first embodiment of the present invention.
Figure 1B:
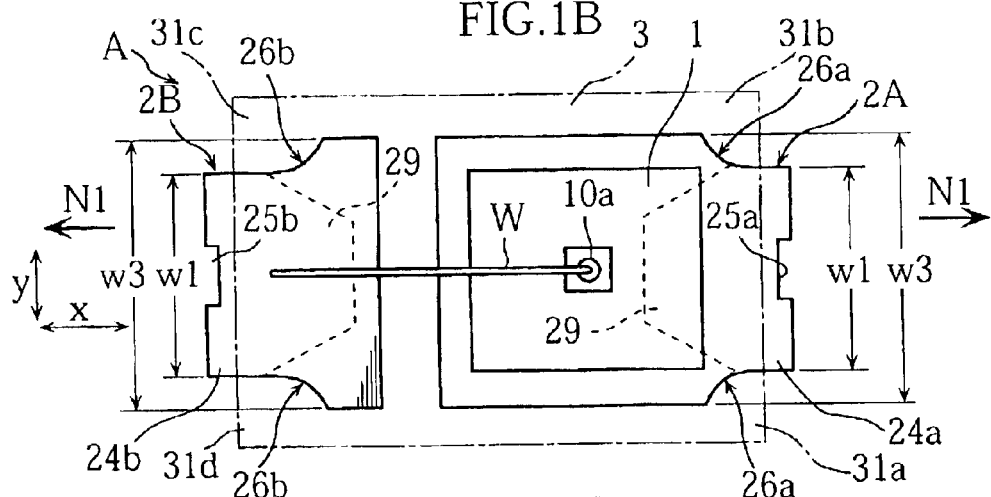
FIG. 1B is a perspective plan view of the same semiconductor device.
Figure 1C:
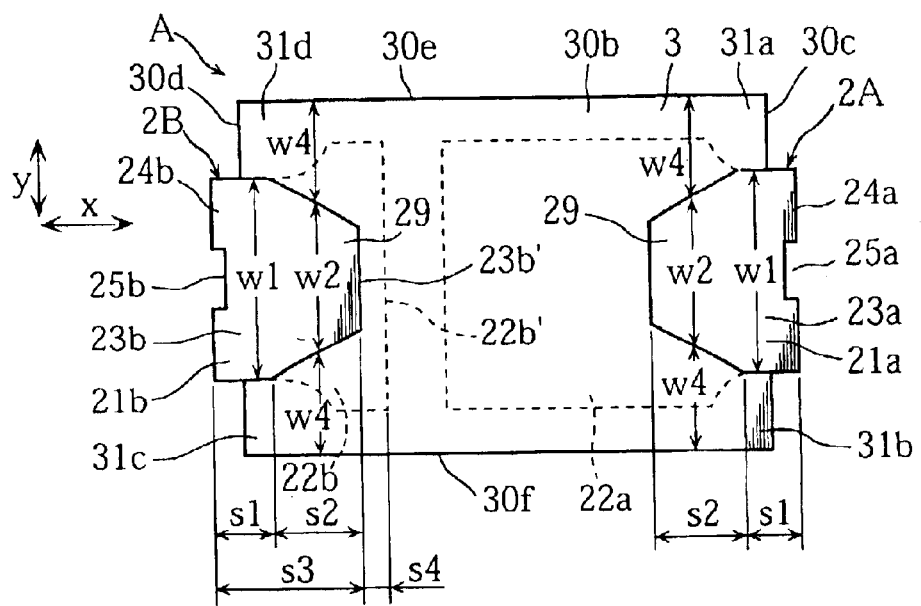
FIG. 1C is a bottom view of the same semiconductor device.

FIGS. 1A–1C show a semiconductor device according to a first embodiment of the present invention. The semiconductor device A of the first embodiment has a semiconductor chip 1, a pair of conductors 2A, 2B, and a resin package 3.

The semiconductor chip 1 includes an upper electrode 10a and a lower electrode (not shown). The semiconductor chip 1 may be selected from different kinds of semiconductor chips, and function or circuit configuration of the semiconductor chip is not limitative. The resin package 3, made of epoxy resin for example, collectively covers the semiconductor chip 1, the paired conductors 2A, 2B and a wire W described later as a whole. The resin package 3 has a general form of a rectangular parallelepiped and includes an upper surface 30a, a bottom surface 30b, a pair of first side surfaces 30c, 30d spaced in a direction x in the figures, and a pair of second side surfaces 30e, 30f spaced in a direction y perpendicular to the direction x.

The paired conductors 2A, 2B, made of a metal plate such as a copper plate, are formed from a frame 5 having a predetermined shape as described later. The conductor 2A has an upper surface on which the semiconductor chip 1 is mounted. The lower electrode of the semiconductor chip 1 is held in conduction with the conductor 2A. The conductor 2B has an upper surface bonded to one end of the wire W, while the other end of the wire is bonded to the electrode 10a of the semiconductor chip 1. In this way, the conductor 2A is used for mounting the semiconductor chip 1, whereas the conductor 2B is used for wire-bonding. Consequently, the conductor 2B as a whole is smaller than the conductor 2A. The paired conductor 2A, 2B are spaced in the direction x.

The upper surface of the conductor 2A, 2B is flat for appropriately mounting the semiconductor chip 1 or for appropriately bonding the wire W. On the other hand, the lower surface of the conductor 2A, 2B is stepped to provide a thicker portion 21a, 21b and a thinner portion 22a, 22b. Such a step may be formed by stamping (pressing) the conductors 2A, 2B or etching the lower surface thereof.

Each thicker portion 21a, 21b has a lower surface substantially flush with the bottom surface 30b of the resin package 3 and exposed as a terminal 23a, 23b for surface-mounting. Further, each conductor 2A, 2B has an outer end portion 24a, 24b slightly projecting from the first side surface 30c, 30d in the direction x. The outer end portion 24a, 24b is formed with a recess 25a, 25b extending thicknesswise of the conductor 2A, 2B.

As clearly shown in FIG. 1C, the thicker portions 21a, 21b are axisymetric to each other and each includes a tapered portion 29. More specifically, the thicker portion 21a, 21b has a constant width w1 in a length s1 from the outer end portion 24a, 24b, while the tapered portion 29 is generally trapezoidal in bottom view in a length s2 with gradually decreasing width w2 toward the center of the resin package 3.

The thinner portion 22a, 22b of each conductor 2A, 2B is provided by the portion other than the thicker portion 21a, 21b. As shown in FIG. 1A, the thinner portion 22a, 22b is buried in the resin package 3 with its lower surface not exposed at the bottom surface of the resin package 3.

As clearly shown in FIG. 1B, the conductor 2A has side edges extending in the direction x and formed with a pair of shoulders 26a. The shoulders 26a bound a portion of the conductor 2A located closer to the center of the resin package 3 and having a width w3 which is greater than the width w1 of another portion located closer to the outer end 24a. Similarly, the side edges of the conductor 2B are formed with a pair of shoulders 26b. The shoulders 26b bound a portion of the conductor 2B located closer to the center of the resin package 3 and having a width w3 which is greater than the width w1 of another portion located closer to the outer end 24b. With such a structure, when a force is applied in the direction of an arrow N to pull out the conductor 2A, 2B, the engagement between the shoulder 26a, 26b and the resin package 3 provides a large resistance which prevents the conductor 2A, 2B from being pulled out in that direction. Further, due to the smaller width w1, each of the four corners 31a–31d of the resin package 3 have an increased width (in the direction y) to resist crack formation at these corners 31a–31d.

The semiconductor device A may be fabricated in the following manner for example.

Figure 2:
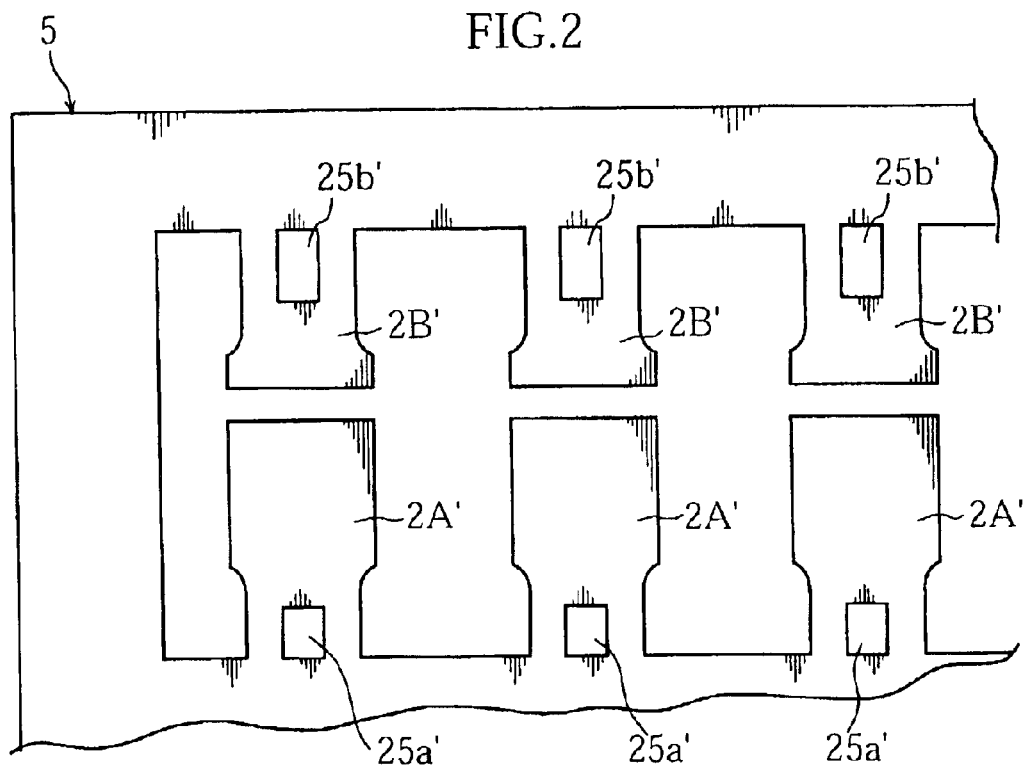
FIG. 2 is a plan view showing a principal portion of an exemplary frame used for fabricating the semiconductor device shown in FIG. 1.

First, a metal frame 5 is prepared as shown in FIG. 2. The frame 5 is prepared by punching a strip-like or rectangular copper plate of a predetermined thickness into a predetermined configuration. The frame 5 is formed with a plurality of leads 2A', 2B' corresponding to the conductors 2A, 2B of the semiconductor device A. The leads 2A', 2B' are partially stamped or etched for providing portions corresponding to the thinner portions 22a, 22b or the thicker portions 21a, 21b of the semiconductor device A. Each of the lead 2A', 2B' is further formed with a through-hole 25a', 25b'. The through-hole 25a', 25b' is also helpful for preventing the resin package 3 of the semiconductor device A from crack formation, as described later.

Figure 3:
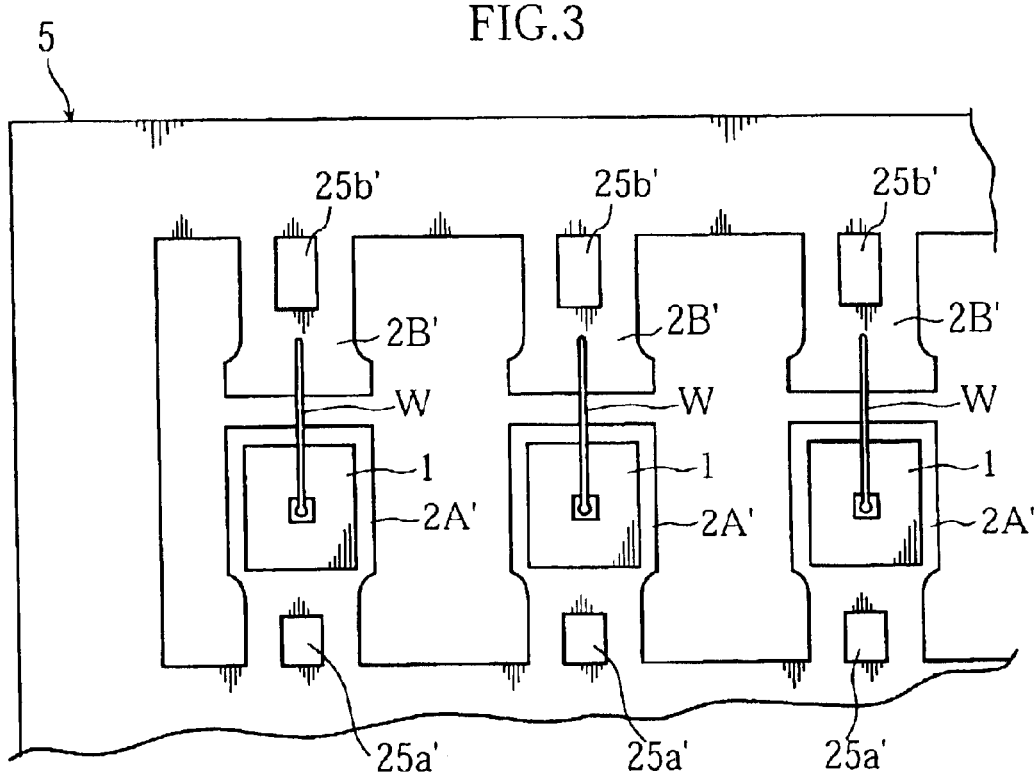
FIGS. 3 and 4 are plan views showing the process steps for manufacturing the semiconductor device shown in FIG. 1.
Figure 4:
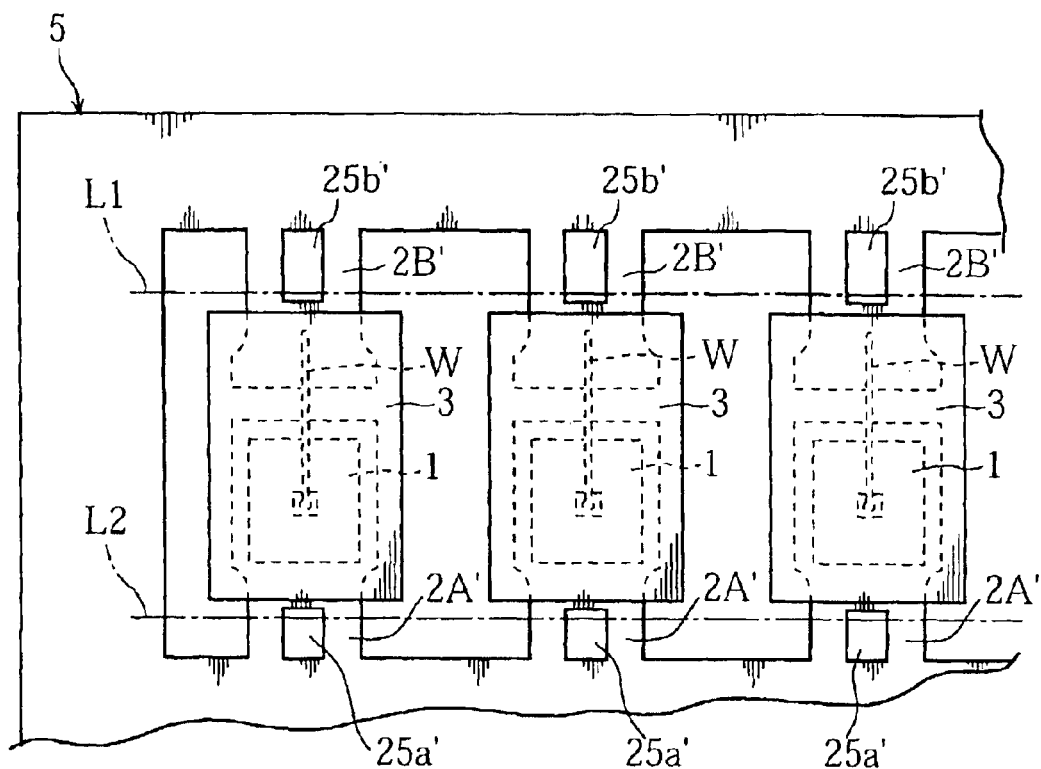

As shown in FIG. 3, the semiconductor chips 1 are mounted on the leads 2A' of the frames 5, and bonding is performed with respect to wires W. Next, as shown in FIG. 4, a plurality of resin packages 3 are formed by transfer molding for example. Subsequently, the leads 2A', 2B' are cut along imaginary lines L1, L2 in the figure. By this cutting, part of the leads 2A', 2B' provide the conductors 2A, 2B of the semiconductor device A. The cutting is performed so as to cross the through-holes 25a', 25b'. The through-holes 25a', 25b' facilitate the cutting of the leads 2A', 2B' and reduce shocks of cutting to eliminate the possibility of crack formation of the resin package 3 by such shocks. Further, the recesses 25a, 25b of the semiconductor devices A are formed by cutting the through-holes 25a', 25b' of the leads 2A', 2B'. With the series of process steps described above, a plurality of semiconductor devices A can be fabricated collectively and efficiently.

The advantages of the semiconductor device A are described below.

First, as shown in FIG. 1A, the semiconductor device A can be surface-mounted on a desired substrate 6 by utilizing the terminals 23a, 23b of the conductors 2A, 2B. More specifically, each of the terminals 23a, 23b of the semiconductor device A can be electrically and mechanically connected to a respective conductor pad 61 of the substrate 6 via solder 60 by reflow soldering. The solder 60 partially flows into the recess 25a, 25b for adhesion to the respective outer end portion 24a, 24b of the conductor 2A, 2B. This increases the bonding area of the solder 60 for improvement of mounting strength.

The conductor 2B is smaller in size than the conductor 2A. However, the terminal 23b needs an area enough to obtain a good bond to the solder 60 for appropriate mounting of the semiconductor device A. For this purpose, the length s3 of the terminal 23b is increased in the direction x shown in FIG. 1C. With the increase of the lengths 3, an edge 22b' of the thinner portion 22b projects from an edge 23b' of the terminal 23b by a reduced length s4. However, the tapered portion 29 of the thicker portion 21b gradually decreases in width in the direction y toward the center of the resin package 3. The thinner portion 22b can be made to have an increased effective area by increasing the width in the direction y by as much as the width decrease of the thicker portion 21b. Consequently, a sufficient resin content exists under the thinner portion 22b within the resin package 3. As a result, when a force is applied downwardly at the bottom surface of the resin package 3 to pull out the conductor 2B, the resin package 3 provides a large resistance against such a force. This eliminates or reduces crack formation of the resin package 3 caused by the force.

Being larger in size than the conductor 2B, it is easier for the conductor 2A to increase the area of the thinner portion 22a and the terminal 23a than it is for the conductor 2B. However, differing from the present embodiment, the conductor 2A may have substantially the same size as the conductor 2B by utilizing a small-sized semiconductor chip 1 for example. Since the conductor 2A includes the tapered portion 29 as does as the conductor 2B, it also has the same advantages as described for the conductor 2B.

Further, since the tapered portions 29 of the thicker portions 21a, 21b decrease in width toward the center of the resin package 3, the dimensions w4 between each thicker portion 21a, 21b and each second side surfaces 30e, 30f of the resin package 3 gradually increases from each of the four corners 31a–31d toward the center of the resin package 3. With this structure, when the resin package 3 is formed with the use of a mold, molding resin flows easily into the four corners 31a–31d. This eliminates the problem wherein the corners are not appropriately filled with molding resin, which prevents crack formation at the corners.

FIGS. 5 through 8 illustrate other embodiments of the present invention. In these figures, the elements identical or similar to those of the first embodiment are designated by the same reference signs.

Figure 5:
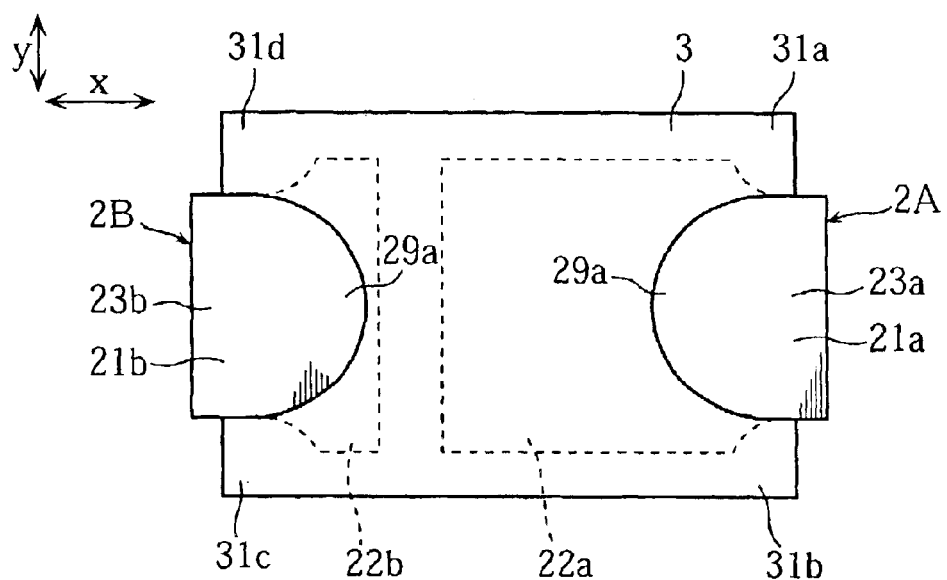
FIG. 5 is a bottom view showing a semiconductor device according to a second embodiment of the present invention.

In a second embodiment shown in FIG. 5, the tapered portion 29a of each thicker portion 21a, 21b is generally semicircular. With such a structure, this embodiment is the same in the basic structure as the embodiment shown in FIG. 1, so that it works in the same manner as the above-described embodiment. Further, since the tapered portions 29a have a smooth and semicircular side surface, molding resin may smoothly flow into the corners 31a–31d in molding the resin package 3. As shown in the figure, the semiconductor device A is not provided with elements corresponding to the recesses 25a, 25b shown in FIG. 1.

Figure 6A:
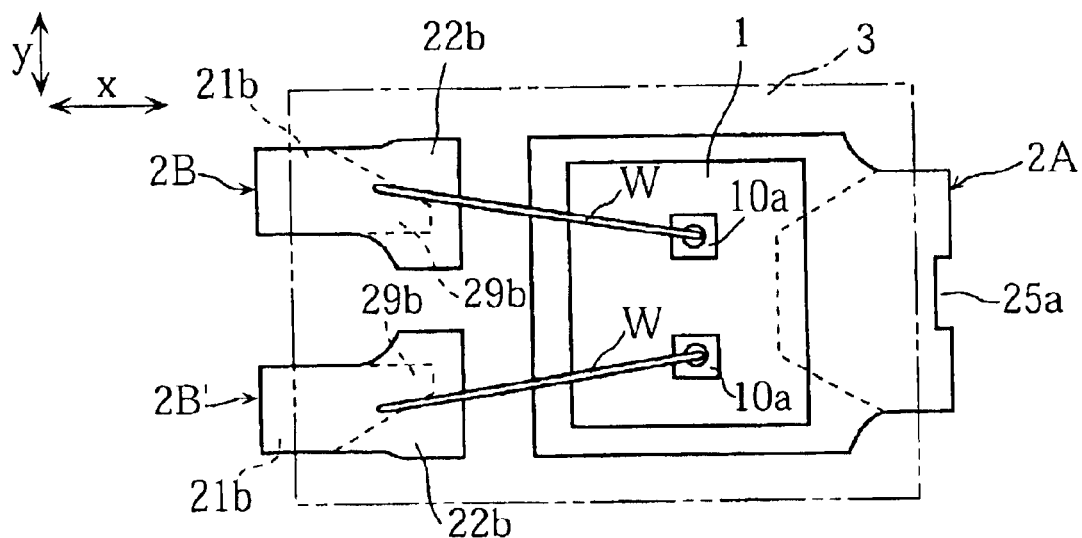
FIG. 6A is a perspective plan view showing a semiconductor device according to a third embodiment of the present invention.
Figure 6B:
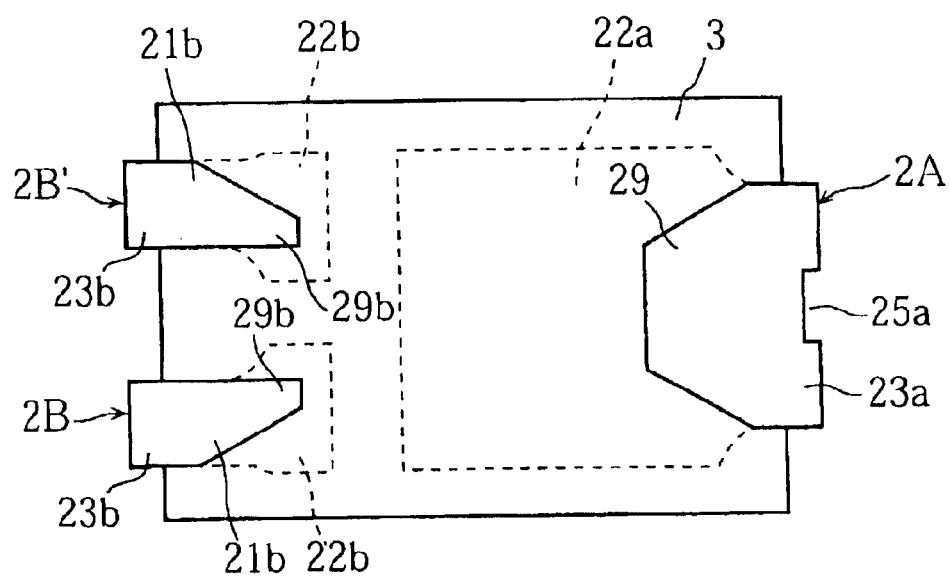
FIG. 6B is a bottom view of the semiconductor device according to the third embodiment of the present invention.

In a third embodiment shown in FIGS. 6A and 6B, the upper surface of the semiconductor chip 1 is formed with a pair of electrodes 10a. A plurality of conductors are provided which include a conductor 2A for mounting the semiconductor chip 1 thereon, and a pair of conductors 2B, 2B' respectively wire-connected to the electrodes 10a. In this embodiment, since the conductor 2A is paired with the two conductors 2B, 2B', each of the conductors 2B, 2B' is reduced in size. Each of the conductors 2B, 2B' has a thicker portion 21b with a tapered portion 29b which is generally trapezoidal or triangular with gradually decreasing width toward the center of the resin package 3.

Figure 7:
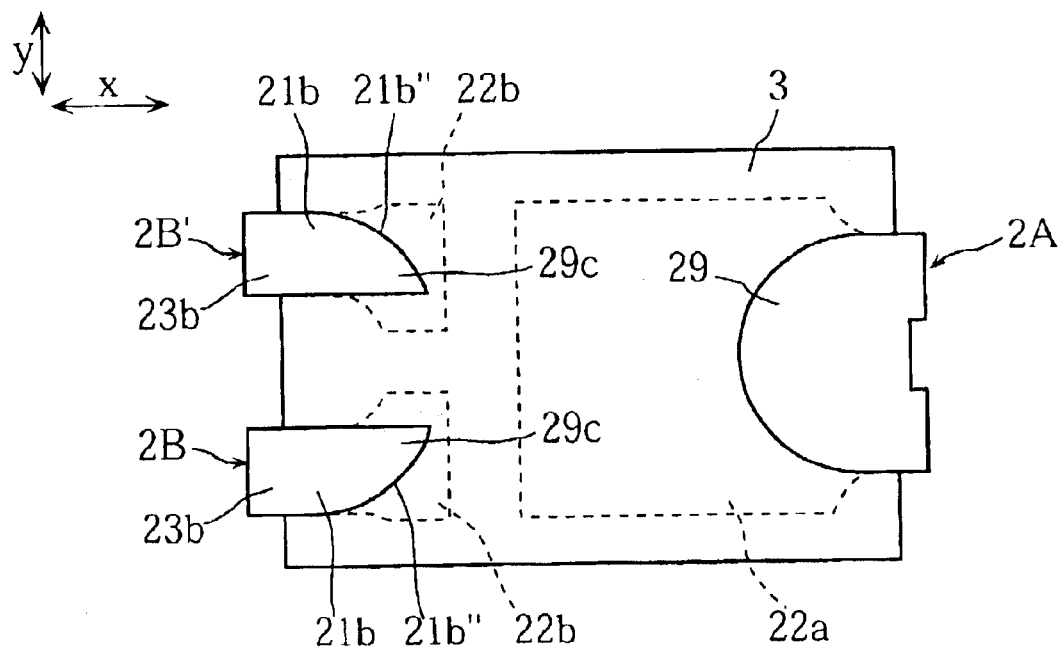
FIG. 7 is a bottom view showing a semiconductor device according to a fourth embodiment of the present invention.

In a fourth embodiment shown in FIG. 7, each thicker portion 21b of the paired conductors 2B, 2B' has a curved side surface 21b". With this structure, the paired conductors 2B, 2B' have a tapered portions 29c decreasing in width toward the center of the resin package 3.

In both of the structures shown in FIGS. 6 and 7, the thicker portions 21b of the conductors 2B, 2B' is elongated in the direction x for the terminals 23b, 23b' to provide a sufficient area. At the same time, the thinner portions 22b are also made to have a sufficient area due to the tapered portion of each thicker portion 21b.

As understood from the above-described fourth embodiment, the number of conductors may be two or no less than three according to the present invention. Further, in the embodiments shown in FIGS. 6 and 7, the two conductors 2A', 2B' are electrically connected to the electrodes of the semiconductor chip 1, respectively. However, the present invention is not limited to this. In the present invention, the upper surface of the semiconductor chip 1 may be formed with only one electrode 10a for example. Utilizing such a chip, one of the conductors 2A', 2B' may be wire-connected to the electrode 10a, whereas the other may be formed as a dummy terminal. Although not electrically connected to the semiconductor chip, the dummy terminal improves the mounting strength in soldering the semiconductor device on a desired surface portion. Further, use may be made of a semiconductor chip having a lower surface formed with no electrode and an upper surface formed with an electrode. Utilizing such a semiconductor chip, the conductor (the conductor 2A) for mounting the semiconductor chip may be used as a dummy terminal.

Figure 8:
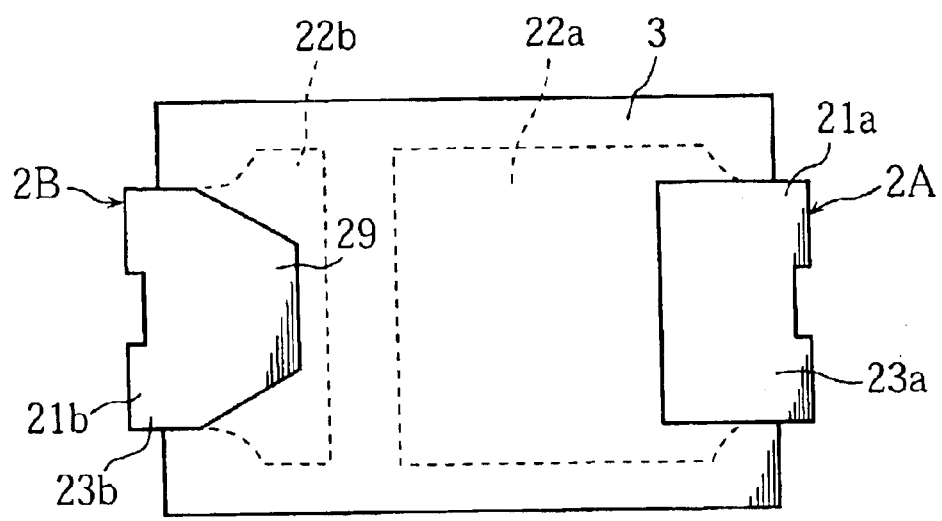
FIG. 8 is a bottom view showing a semiconductor device according to a fifth embodiment of the present invention.
Figure 9A:
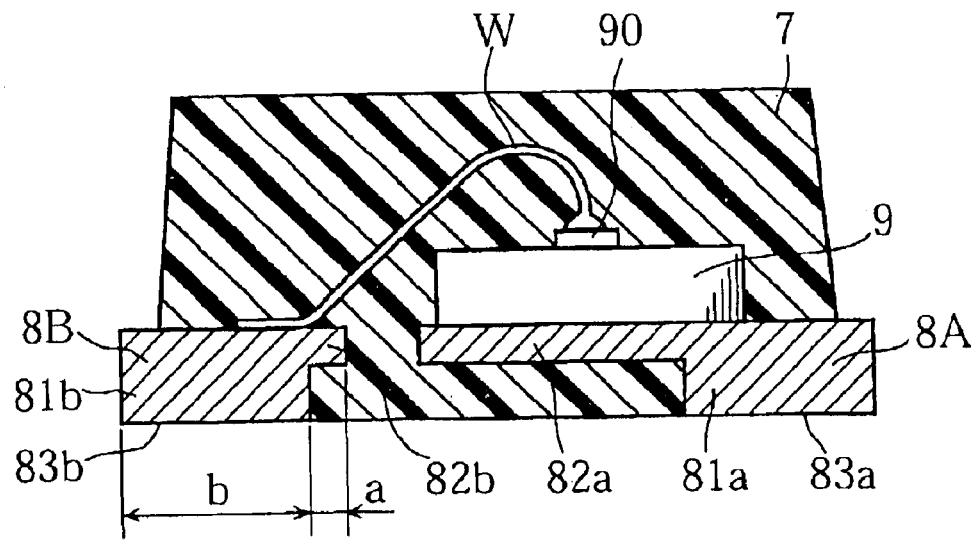
FIG. 9A is a sectional view showing an example of prior art semiconductor device.
Figure 9B:
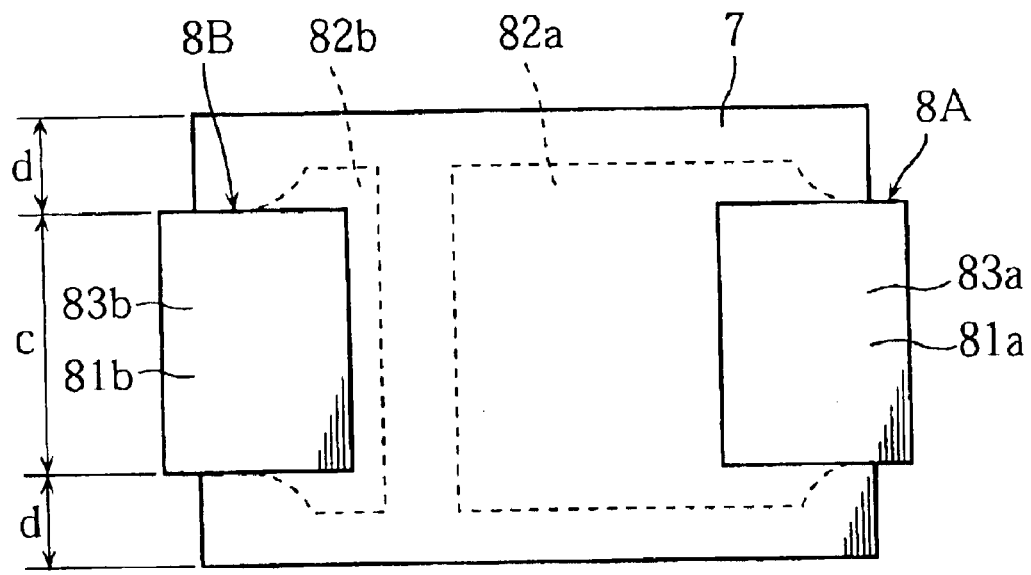
FIG. 9B is a bottom view of the prior art semiconductor device.

Of the two conductors 2A, 2B In a fifth embodiment shown in FIG. 8, the conductor 2B is formed with a tapered portion 29, whereas the conductor 2A is not formed with such a tapered portion 29 but provided with a rectangular thicker portion 21a. Thus, at least one of the plural conductors may have a non-rectangular thicker portion as intended in the intention of the present invention. If at least one of the plural conductors has a non-rectangular thicker portion as intended in the present invention, the resin package is less likely to suffer crack formation than a prior art resin package.

The present invention is not limited to the specific embodiments described above. Various modifications may be made with respect to the details of the semiconductor device. For example, the technical scope of the present invention covers any conductors provided with a non-rectangular thicker portion having a partially or entirely uneven width. Further, the conductor and the resin package may be made of any material. As described above, the semiconductor chip may be of any kind and have an internal circuit arrangement of any kind. In addition, the number of chips may not be limited to one. The resin package may be internally provided with a plurality of semiconductor chips.

What is claimed is:

1. A semiconductor device comprising:

a semiconductor chip;

a plurality of conductors electrically connected to the semiconductor chip; and a resin package for sealing the semiconductor chip and the conductors;

wherein each of the conductors has a thicker portion and a thinner portion, the thicker portion including a lower surface exposed at a bottom surface of the resin package as a terminal for surface-mounting; and wherein the thicker portion of at least one of the conductors is non-rectangular with partially or entirely uneven width.

2. The semiconductor device according to claim 1, wherein the resin package includes a pair of first side surfaces spaced in a direction x and a pair of second side surfaces spaced in a direction y perpendicular to the direction x;

wherein the terminals of the conductors are paired with and spaced from each other in the direction x; and wherein the non-rectangular thicker portion includes a tapered portion having width increasing in the direction y toward a center of the resin package.

3. The semiconductor device according to claim 2, wherein the tapered portion is generally trapezoidal.

4. The semiconductor device according to claim 2, wherein the tapered portion is generally triangular.

5. The semiconductor device according to claim 2, wherein the tapered portion is generally semicircular.

6. The semiconductor device according to claim 1, wherein each of the conductors has an outer end projecting from a respective one of the first side surfaces and formed with a recess.

7. The semiconductor device according to claim 6, wherein the recess extends over an entire thickness of the thicker portion.

* * * * *